United States Patent [19]

Petrangelo

[11] 4,092,699
[45] May 30, 1978

[54] SIMPLIFIED RACK FOR ELECTRONIC COMPONENTS

[75] Inventor: Amedio D. Petrangelo, Rochester, N.Y.

[73] Assignee: Stromberg-Carlson Corporation, Rochester, N.Y.

[21] Appl. No.: 812,574

[22] Filed: Jul. 5, 1977

[51] Int. Cl.² ............................................. H02B 1/02
[52] U.S. Cl. ...................................... 361/415; 211/41
[58] Field of Search .......................... 361/415; 211/41

[56] References Cited

U.S. PATENT DOCUMENTS 3,699,393  10/1972  Reimer ................................. 361/415
3,716,760   2/1973  Bertellotti et al. .................... 361/415

Primary Examiner—David Smith, Jr.
Attorney, Agent, or Firm—Michael F. Oglo; Hoffman Stone

[57] ABSTRACT

A unitized shelf and guide framework for supporting so-called printed circuit cards in spaced alignment. Open-work shelves are joined, for example by welding, in accurate alignment to corner posts to form a frame. Each shelf consists of longitudinal channel members extending in parallel array between end flanges, and may be formed by punch press of a single piece of metal. The channel members are covered by split sheathes, which may be molded of a plastic, and which carry transversely extending alignment bosses for guiding and positioning the circuit cards. A wired back plane of the usual kind is secured in predetermined alignment behind each shelf, and carries the usual receptors for the pin terminals that extend from the back edges of the cards.

2 Claims, 6 Drawing Figures

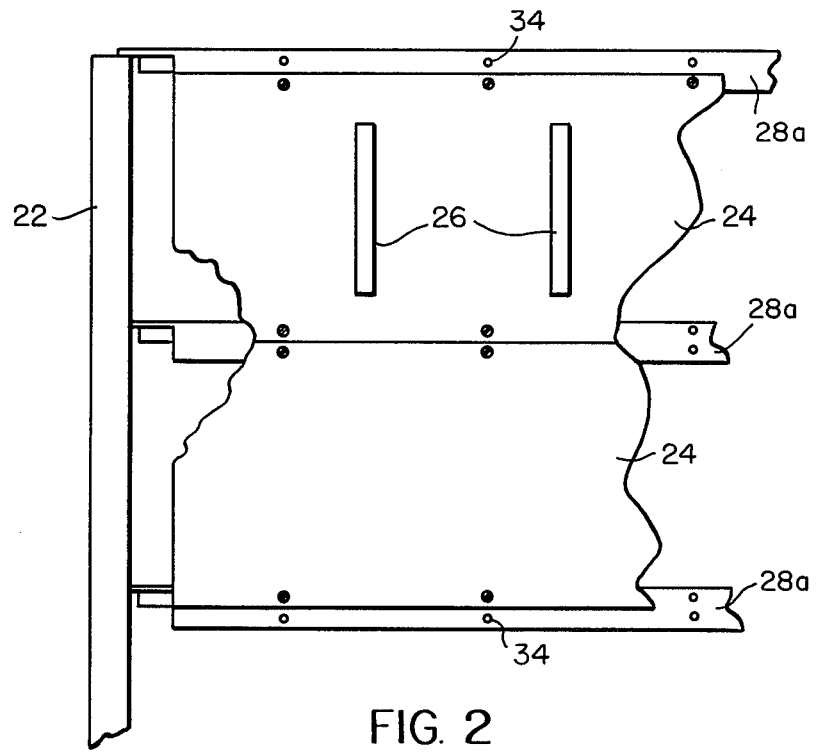
FIG. 2
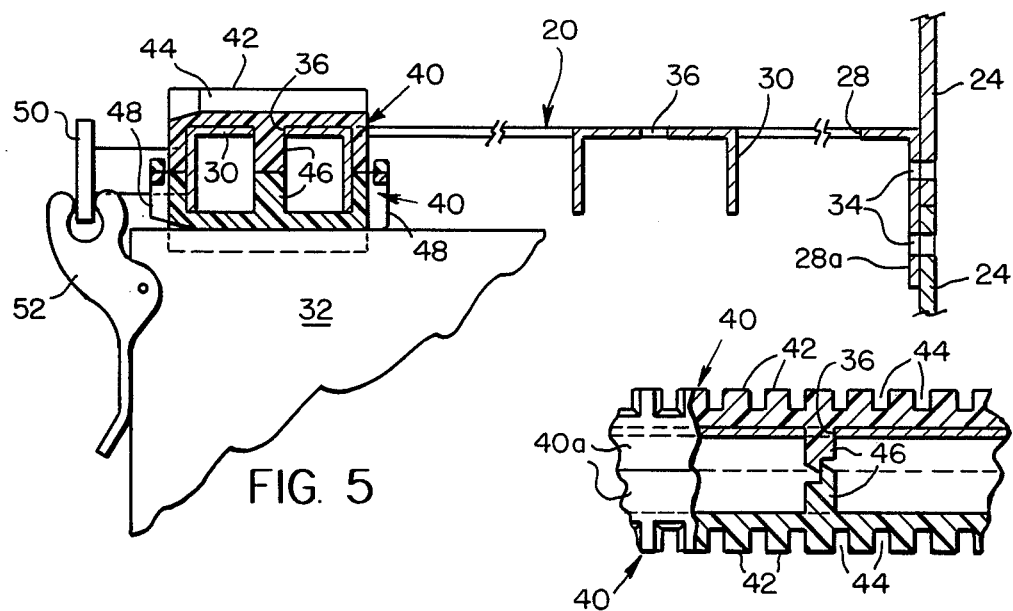
FIG. 5
FIG. 6

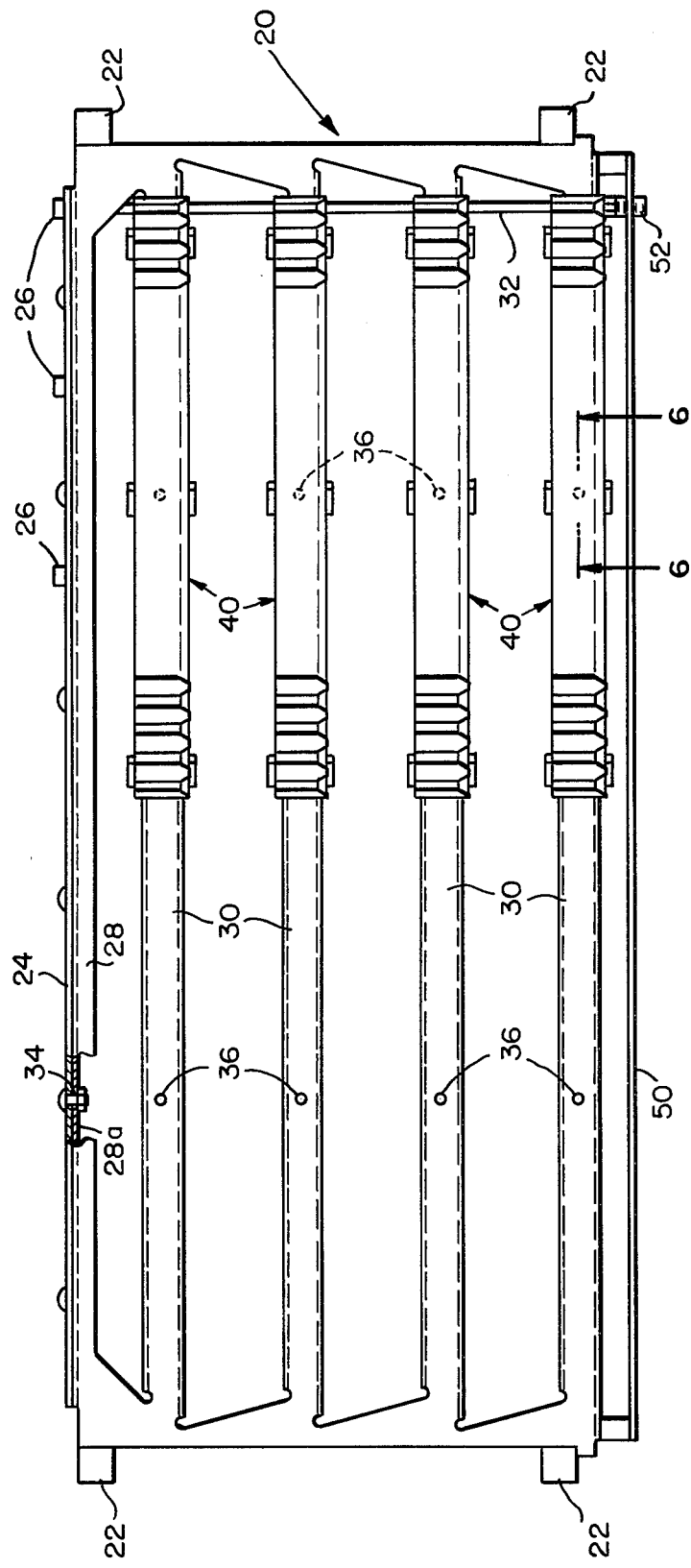
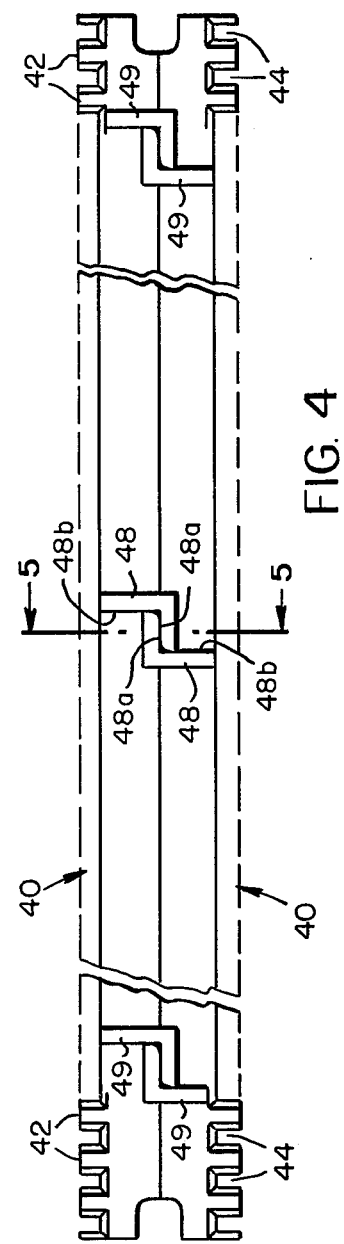
FIG. 3
FIG. 4

SIMPLIFIED RACK FOR ELECTRONIC COMPONENTS

BRIEF DESCRIPTION

This invention relates to a novel rack for guiding and supporting objects such as electronic gear, especially printed circuit cards and other plug-in components in spaced, parallel array.

Racks for holding electronic gear have heretofore been relatively complex, have included large numbers of separate parts and fasteners, and have required a great deal of labor to assemble. The present invention has for its principal object a substantial simplification in racks of this kind, together with a significant reduction in cost, with respect both to materials and to labor required for assembly. The unitized design of the instant invention eliminates the prior art's need for a plurality of separate cells within a main frame or rack.

Briefly, the invention contemplates use of a unitary, punched shelf as the basic component of a rack. Alignment perforations are punched or drilled accurately in selected flanges of the shelves, and any desired number of similar shelves are placed in a welding jig and welded to corner posts to form a rigid, cuboidal framework. Each shelf includes longitudinal channel members, two or more according to the designer's choice, and the channels are covered with split sleeves, which may be molded of plastic, and which carry alignment slots or grooves for guiding and positioning the printed circuit cards. The two halves of each sleeve are identical to each other, and carry interlocking alignment pins and retaining dogs. They fit together with a snap, over-center action, requiring no other fasteners such as screws or clips. Alignment pins of the sleeves extend through alignment holes in the channel members, and also interlock with each other to latch the sleeves in place.

A wired back plane is ordinarily secured behind each shelf of the array, being aligned by the alignment holes in the rear flanges of the shelves. In the conventional way, the wired back planes carry receptors for the plated contacts on the printed circuit cards. An ejector bar may be secured adjacent to the front edge of each shelf for engagement by the so-called card pull levers carried by the printed circuit cards, and the assembly may be enclosed within outer panels as desired.

The main structural members of the assembly constitute a weldment. The plastic sleeves are self securing. The use of separate fasteners such as screws and clips is avoided, except for aligning and securing the wired back planes and securing the ejector strips. The over-all cost of the assembly is very substantially reduced relative to other known types of racks heretofore used for mounting electronic printed circuit cards and other gear of the so-called plug-in kind.

DETAILED DESCRIPTION

A presently preferred embodiment of the invention will now be described in detail in connection with the accompanying drawings, wherein:

FIG. 2 is a fragmentary, rear elevational view of the rack shown in FIG. 1;

FIG. 3 is a plan view, with parts broken away, of one of the shelves of the rack;

FIG. 4 is a longitudinal elevational view of one of the channel members of the shelf shown in FIG. 3;

FIG. 5 is a cross sectional view taken along the line 5—5 of FIG. 4; and

FIG. 6 is a longitudinal sectional view taken along the line 6—6 of FIG. 3.

Figure 1:
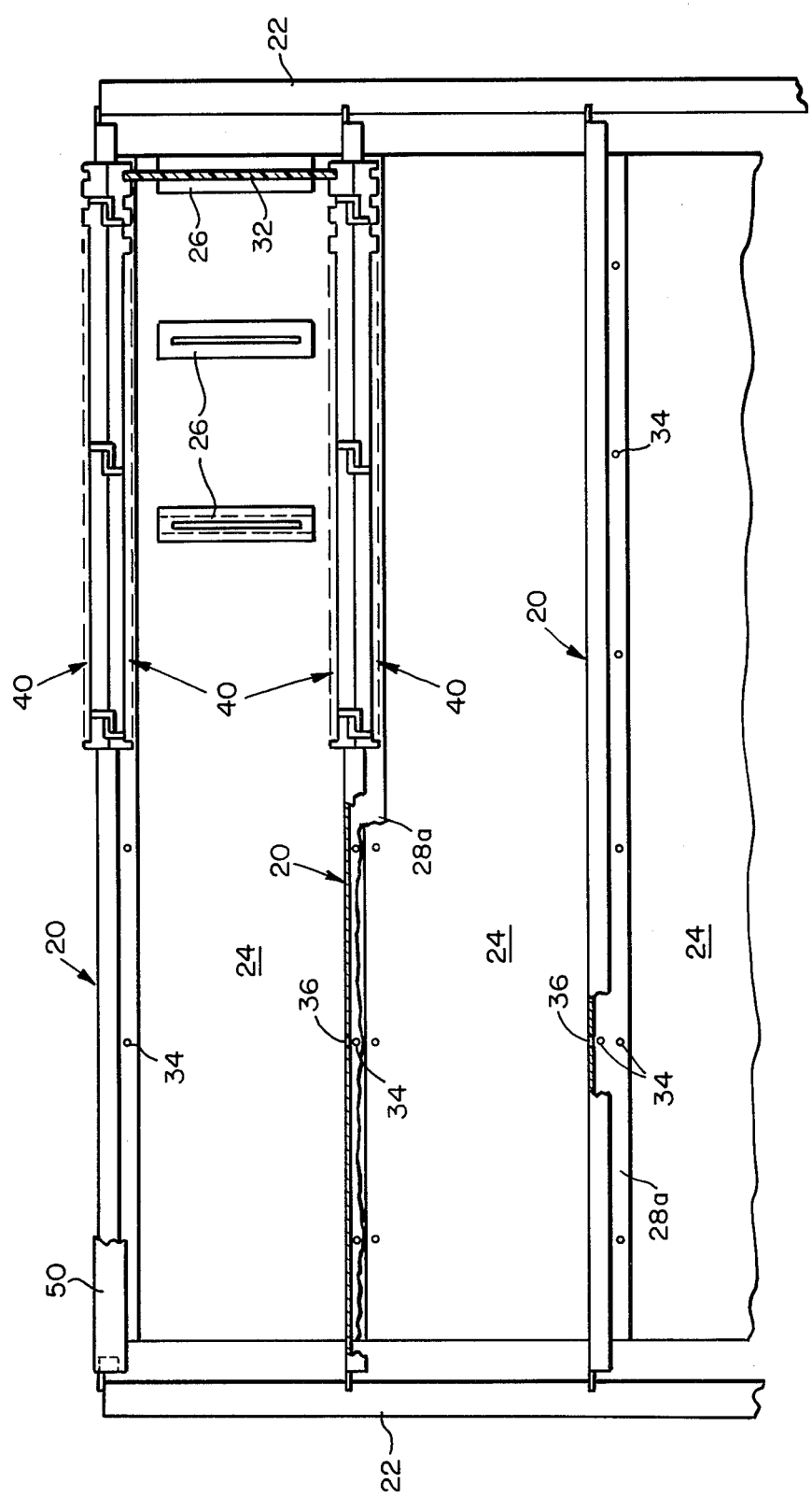
FIG. 1 is a fragmentary, front elevational view of a rack according to the invention.

Referring first to FIG. 1, a typical rack according to the invention includes any desired number of shelves 20 welded at their corners to supporting posts 22 in accurate alignment with each other to form a unitized weldment. Alignment holes, to be described in greater detail hereinafter, are punched or drilled in the shelves for aligning them for welding and for aligning other parts of the assembly. Conventional wired back planes 24, which carry plug receptacles 26, are aligned and secured at the rear of each of the shelves 20, the fronts and ends of the shelves being open.

Each of the shelves 20 is formed as a single, unitary stamping including a longitudinal rear flange 28 and at least two longitudinal channel members 30. The number of channel members 30 will depend on the designer's choice taking into consideration the size of the printed circuit cards 32 to be accommodated, the amount of support they require and the required air space or opening for heat dissipation. Index holes 34 and 36 are formed at accurately spaced locations in the vertical web 28a of the rear flange 28 and in the horizontal webs of the channel members 30 for aligning the shelves relative to each other for welding, and for aligning the wired back planes 24 and card guide members 40.

The number of alignment holes 34 and 36 is, again, a matter of designer's choice in view of the over all length of the shelves, the accuracy attainable in welding them together, the accuracy attainable in forming the guide members 40, and the difference between the thermal expansion characteristics of the guide members 40 and the channel members 30. In the illustrated embodiment the shelves are intended to be about 35 inches long, and it is presently thought that two alignment holes 34 in the rear flange 28a and two in each of the channel members may be required to achieve the desired accuracy of card alignment. The choice, however, is to a large extent arbitrary, and is not a limiting factor in the practice of the invention.

The card guide members 40 are an important feature of the invention. They may be cast or molded of any of many materials. They carry integrally formed outer bosses 42 which define transversely extending slots 44 that receive, guide and secure the cards 32. They are shaped to fit upon the channel members 30, enclosing them in place, one above and one beneath.

The guide members 40 are secured to each other in pairs by a snap action, over center arrangement, part of which also serves to align them accurately along the channel members. A locator and securing pin 46, also integrally molded, extends inwardly from the bight portion of each member 40 at an accurately predetermined location along its length. The nose of the pin 46 is cam shaped, like the tip of a spring latch bar, and projects beyond the side walls 40a. A pair of dogs 48 are also molded in the guide members 40 on the outer faces of their side walls, with horizontal retaining surfaces 48a lying in approximately the same plane as the edges of the side walls, and with vertical detent surfaces 48b slightly off-set longitudinally from the center line of the pin 46.

The guide members 40 are all identical to each other. It can be seen that when one guide member 40 is inverted by rotating it about an axis transverse to its length, its pin 46 will be situated complementarily to the pin of another member 40 that is held in its original position, and if the two members are then moved in translation the pins can be made to interengage, and so also the dogs 48. The horizontal legs 48a of the dogs 48 will then hold the two members together, and their tips will meet the vertical legs 48b to stop further movement in the engaging direction, while the pins 46 will restrain the members against disengaging motion. The pin 46 of the upper one of each pair of guide members extends through the guide hole 36 in the channel member 30, thus serving also to align the guide members lengthwise of the channel member 30.

Assembling the guide members 40 on the channel members is quick and simple; no tools or separate fasteners are required. One guide member 40 is placed on top of the channel member 30, which it fits fairly closely, and moved along it until its pin 46 drops through the alignment hole 36. A second guide member 40 is then inverted, placed beneath the first one in slightly off-set position and with the free ends of its lateral dogs 48 facing the free ends of the dogs of the upper member, and then simply moved along the channel member until the two pins 46 interlock with an over center snap action.

Auxiliary dogs 49 may be formed, as shown, near the ends of the members 40 to provide added rigidity in the final assembly and to minimize warping of the members 40.

A separate ejector bar 50 is secured along the front of each shelf for holding a position identifying label (not shown) and for engagement by the latching levers 52 carried by the circuit cards. Separate fastening devices such as screws are used for securing the bars 50, and also the wired back planes 24, but aside from this the assembly is free of small parts.

Exterior panels (not shown) may be added as desired for enclosing the assembly for dress, dust protection and the like.

The wired back planes 24 per se are not an essential part of the invention, and are shown only because they are commonly used in mounting arrangements for plug-in circuit components. It is believed that the mounting system of the invention will be found highly advantageous in many instances where the wired back planes are not included.

It should also be pointed out that the cross sectional shape of the channel members is not limiting, but is also a matter of designer's choice, whether it be U-shaped as shown, semicircular, or otherwise.

What is claimed is:

1. A rack for supporting objects generally similar to printed circuit cards and other plug-in electronic components in spaced, parallel alignment comprising a plurality of generally rectangular open-work shelves, and four corner posts integrally joined to said shelves adjacent to their corners, each of said shelves including a plurality of longitudinal channel members, each of said channel members having a perforation at a predetermined location, and guide members formed as split sleeves fitted on said channel members and closely enveloping them, each of said guide members including outer bosses defining transverse slots for receiving and guiding edge portions of objects to be supported and an inwardly extending combination latch and alignment pin, the alignment pin of one of each pair of said guide members extending through the perforation in the channel member enveloped by the pair for aligning the guide members relative to the channel member, said pins having latch cam shaped nose portions extending beyond the side walls of the guide members, said guide members also including detent dogs on the outer surfaces of their side walls, the arrangement being such that when the two guide members of each pair are placed together with the edges of the side walls of one abutting the edges of the side walls of the other and the members are moved lengthwise relative to each other their pins latch and their dogs engage to hold the guide members together and prevent relative translation.

2. A guide assembly for supporting objects generally similar to printed circuit cards comprising an elongated split sleeve having outwardly extending bosses on its opposite longitudinal surfaces defining transversely extending slots, the slots on the two surfaces being in predetermined alignment relative to each other, the two halves of said sleeve being substantially identical to each other, a pin extending inwardly from each half of said sleeve beyond the edges thereof and having its tip formed as a latch cam, detent dogs carried by each half of said sleeve on the outer edges thereof, the dogs of each half being engaged with the dogs of the other half, the pins of the two halves also being interengaged, the dogs acting to hold the two halves together against direct separation, against transverse translation, and against longitudinal translation in the latch engaging direction, the pins serving to hold the two halves against longitudinal translation in the disengaging direction.

* * * * *